US011223358B2

(12) United States Patent
Sanchez et al.

(10) Patent No.: US 11,223,358 B2
(45) Date of Patent: Jan. 11, 2022

(54) IO ANALOG RAIL CONTROL CIRCUIT FOR POWER RAMPS

(71) Applicant: NXP USA, Inc., Austin, TX (US)

(72) Inventors: Hector Sanchez, Austin, TX (US); Gayathri Bhagavatheeswaran, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/745,605

(22) Filed: Jan. 17, 2020

(65) Prior Publication Data

US 2021/0226630 A1 Jul. 22, 2021

(51) Int. Cl.
*H03K 19/003* (2006.01)
*H03K 19/0185* (2006.01)

(52) U.S. Cl.
CPC ............ *H03K 19/00384* (2013.01); *H03K 19/018521* (2013.01)

(58) Field of Classification Search
None
See application file for complete search history.

(56) References Cited

U.S. PATENT DOCUMENTS

| 5,896,045 | A | * | 4/1999 | Siegel | ............ | H03K 19/018521 326/81 |
| 5,917,358 | A | | 6/1999 | Sanchez et al. | | |
| 6,342,802 | B1 | | 1/2002 | Forehand | | |
| 6,842,058 | B2 | * | 1/2005 | McNitt | ................. | H03K 17/166 326/27 |
| 7,193,441 | B2 | * | 3/2007 | Chen | ................. | H03K 19/00315 326/81 |
| 9,383,794 | B2 | | 7/2016 | Aggarwal et al. | | |
| 9,893,730 | B1 | | 2/2018 | Ucar | | |
| 2014/0253534 | A1 | * | 9/2014 | Kim | ..................... | G09G 3/3688 345/213 |
| 2019/0149149 | A1 | | 5/2019 | Pan et al. | | |

OTHER PUBLICATIONS

Freescale Semiconductor; Technology Solutions Organization—Design Technology; Specification; cln28hpm i043um18dgofc Library; Apr. 24, 2012; pp. 1-124.

\* cited by examiner

*Primary Examiner* — Crystal L Hammond

(57) ABSTRACT

Disclosed is a control circuit for protecting MOSFETs in I/O buffers or other devices from overvoltage damage, especially during power ramp up. The control circuit can perform additional functions. In one embodiment an integrated circuit (IC) includes input/output (I/O) buffers coupled to an output supply voltage terminal that is configured to receive an output supply voltage Vddio. Each of the I/O buffers has a bias voltage generator that is configured to generate a first bias voltage with a magnitude that depends on a control signal; an output stage that receives the first bias voltage, wherein the output stage is configured to drive an I/O pad based upon a data signal received at the I/O buffer. The IC also includes an I/O buffer controller coupled to the I/O buffers and configured to generate the control signal based upon a magnitude of the output supply voltage Vddio.

16 Claims, 11 Drawing Sheets

IO ANALOG RAIL CONTROL CIRCUIT FOR POWER RAMPS

BACKGROUND

Integrated circuits (ICs) such as System on Chips (SoCs), microcontrollers (MCUs), etc., communicate with external components such as dynamic random access memory (DRAM), dual data rate (DDR) memory, etc., through input output (I/O) buffers. Generally I/O buffers have input interfaces for communicating with internal core circuits (e.g., a central processing unit) of the IC, and output interfaces for communicating with components external to the IC via I/O pads. The input and output interfaces typically operate in different voltage domains.

Metal oxide field effect transistors (MOSFETs) can be damaged if the gate to source (Vgs) or gate to drain (Vgd) voltage exceeds a maximum value TrMax. As semiconductor technology advances, and transistor size reduces, TrMax also reduces. Unfortunately the output interfaces of I/O buffers in modern ICs are often required to operate with an output supply voltage Vddio that exceeds TrMax. Protection MOSFETs can be added to I/O buffers to ensure reliable operation at high output supply voltages Vddio (e.g., Vddio=3.3V). The gates of these protection MOSFETs, however, must be carefully biased, especially during power ramp up.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items.

DETAILED DESCRIPTION

Disclosed is a control circuit for protecting MOSFETs in I/O buffers or other devices from overvoltage damage, especially during power ramp up, and additional functions. I/O buffers should be tristated when the core supply voltage Vdd and the output supply voltage Vddio are below respective threshold values, which is often the case when Vdd and Vddio are ramping up. If not tristated I/O buffers may send signal "glitches" to external components during voltage ramp up. The control circuit of this disclosure can tristate I/O buffers when Vdd or Vddio are below respective threshold values to prevent them from sending signal glitches.

Figure 1:
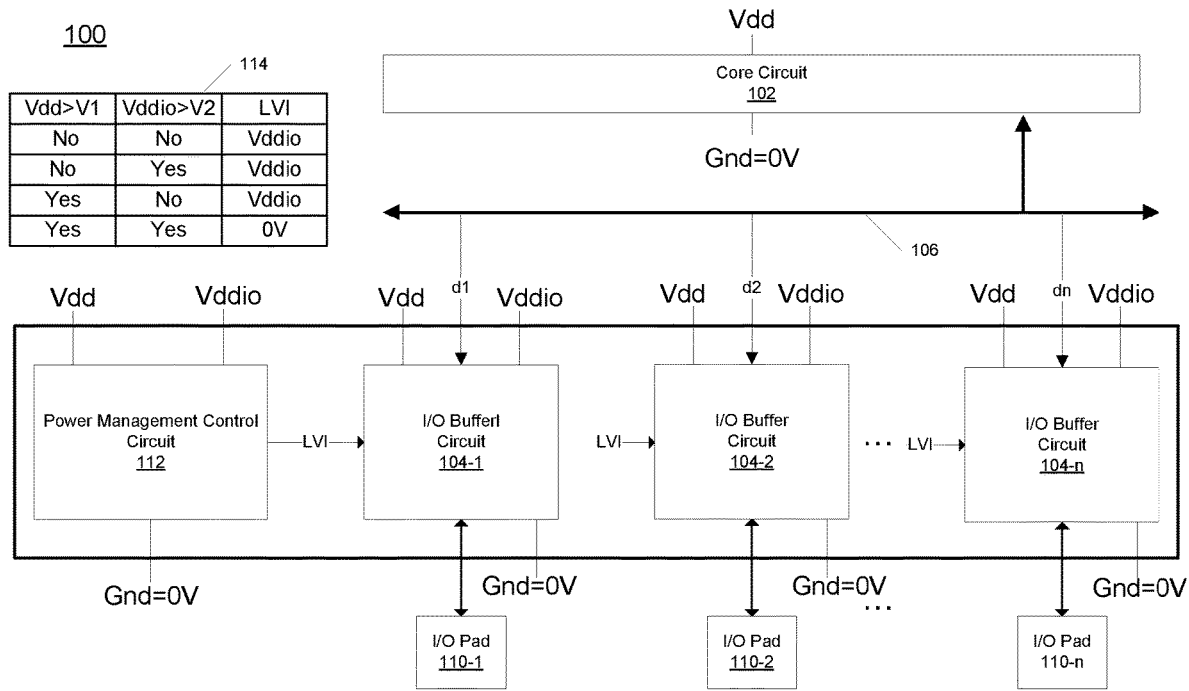
FIG. 1 is a block diagram that illustrates an example IC that includes power management circuit (PMC).
Figure 2:
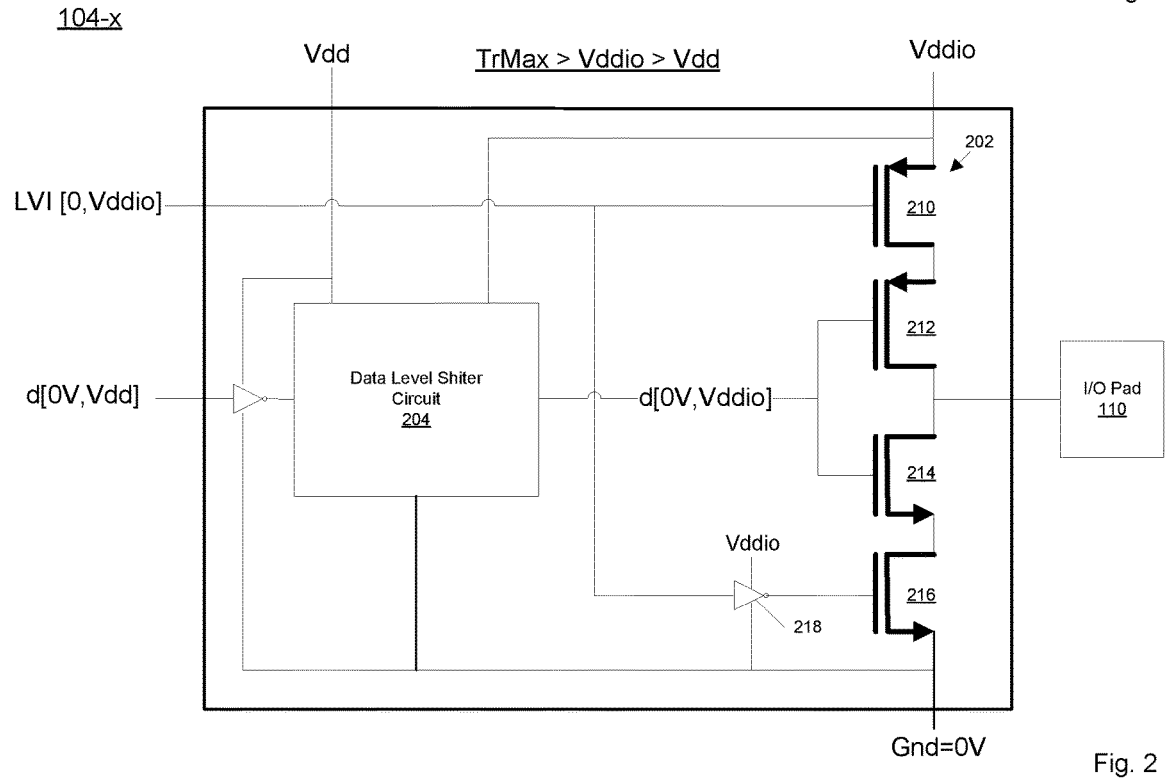
FIG. 2 is a mixed schematic and block diagram illustrating an example I/O buffer employed in the IC of FIG. 1.

To illustrate problems caused by overvoltage, FIG. 1 illustrates an IC 100 in block diagram form, which contains core circuit 102 in data communication with a bank of I/O buffer circuits 104 via data bus 106. Core circuit 102 is coupled between supply voltage Vdd and ground Gnd=0V. Core circuit 102 may include various devices including a central processing unit (CPU) that communicates directly or indirectly with external components via I/O buffers 104. FIG. 2 illustrates relevant components of an example I/O buffer 104, which includes an output stage 202 coupled between output supply voltage Vddio and ground Gnd=0V. Output stage 202 includes a stack of MOSFETs 210-216 and an inverter circuit 218.

Core circuit 102 and output stage 202 operate in distinct voltage domains. A binary signal in the core voltage domain has logic voltage levels [0V,Vdd], where 0V is the logic low voltage, and Vdd is the logic high voltage level. A binary signal in the output voltage domain has logic voltage levels [0V,Vddio], where 0V is the logic low voltage, and Vddio is the logic high voltage level. Level shifters can translate the voltage levels of signals. Level shifters are commonly employed in I/O buffers to translate the voltage levels of signals as they move from the core voltage domain to the output voltage domain. Each I/O buffer 104 includes a level shifter circuit 204 that translates the logic levels of data signal d from [0V,Vdd] to [0V,Vddio].

At power up, supply voltages Vdd and Vddio are initially at 0V and increase until they reach target levels (e.g., Vdd=0.8V and Vddio=3.3V). I/O buffers 104 should be tristated until Vdd and Vddio reach respective minimum voltage values. With continuing reference to FIGS. 1 and 2, IC 100 includes a power management control (PMC) circuit that controls I/O buffers 104 via a low voltage inhibiter (LVI) signal. PMC circuit 112 asserts LVI (i.e., LVI=Vddio) when supply voltages Vdd or Vddio are below minimum thresholds V1 and V2, respectively. MOSFETs 210 and 216 in each of the I/O buffers 104 receive the LVI signal and its inversion from PMC 112 and inverter circuit 218. When LVI is asserted, MOSFETs 210 and 216 are deactivated, and as result output stage 202 is tristated. When Vdd and Vddio are respectively V1 and V2 or higher, PMC 112 de-asserts LVI signal (i.e., LVI=0V), which in turn activates MOSFETs 210 and 216. Output stage 202 can then drive I/O pad 110 based upon input signal d received from level shifter 204. Table 114 shows the state of LVI based on supply voltages Vdd and Vddio.

MOSFETs can be damaged if subjected to voltages that exceed their maximum rating TrMax. For example, if Vgd or Vgs of any of the MOSFETs 210-218 exceeds TrMax, that MOSFET can be rendered permanently inoperable. In the example shown within FIGS. 1 and 2, TrMax for all of the MOSFETs in I/O buffer 104 and PMC 112 are greater than supply voltages Vdd and Vddio. Accordingly, there is no risk that any of the devices, including MOSFETs 210-218, will be damaged by overvoltage.

Figure 3:
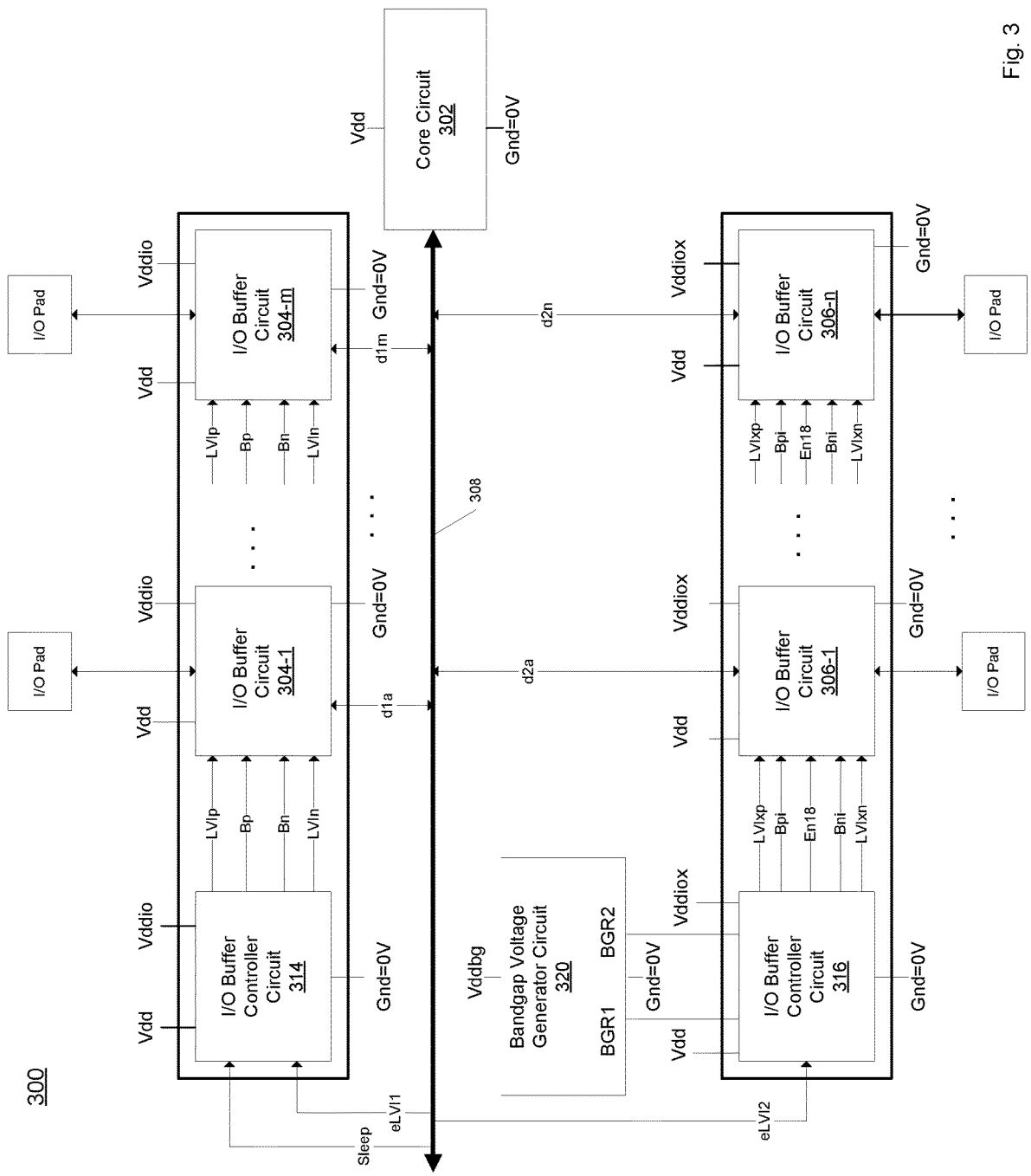
FIG. 3 is a block diagram that illustrates an example IC that lacks a PMC.

FIG. 3 illustrates an IC 300 in block diagram employing MOSFETs that have a lower TrMax when compared to that of the MOSFETs employed within IC 100 of FIG. 1. For the purposes of explanation FIG. 3 will be described with MOSFETs having a maximum rating of TrMax=1.8V. IC 300 contains core circuit 302 in data communication with a first bank of I/O buffer circuits 304 and a second bank of I/O buffer circuits 306 via data bus 308. Core circuit 302 is coupled between Vdd=0.8V and Gnd=0V. Core circuit 302 may include various devices including a CPU that that communicate with external components via I/O buffers 304 or I/O buffers 306.

As will be more fully described below each of the I/O buffers 304 includes an output interface that includes an output stage coupled between output supply voltage Vddio=3.3V and Gnd=0V. The I/O buffers 304 are also referred to herein as the 33I/O buffers 304. Each of the I/O buffers 306 includes an output interface that includes an output stage coupled between output supply Vddiox and Gnd=0V, where Vddiox can vary between 1.8V and 3.3V. For the purposes of explanation, Vddiox=1.8V or Vddiox=3.3V. The I/O buffers 306 are also referred to herein as the 3318I/O buffers 306.

Vdd=0.8V is less than TrMAx=1.8V, and as a result MOSFETs coupled to Vdd will not be damaged by overvoltage. However, output supply voltage Vddio=3.3V exceeds TrMAx=1.8V, and as a result MOSFETs coupled to Vddio can be damaged. The same is true for MOSFETs coupled to Vddiox when it is set to 3.3V. As will be more for described below, protection MOSFETs can be added to avoid overvoltage damage. Noticeably lacking from IC 300 is a PMC circuit like that shown in FIG. 1.

The 33I/O Buffer

Figure 4:
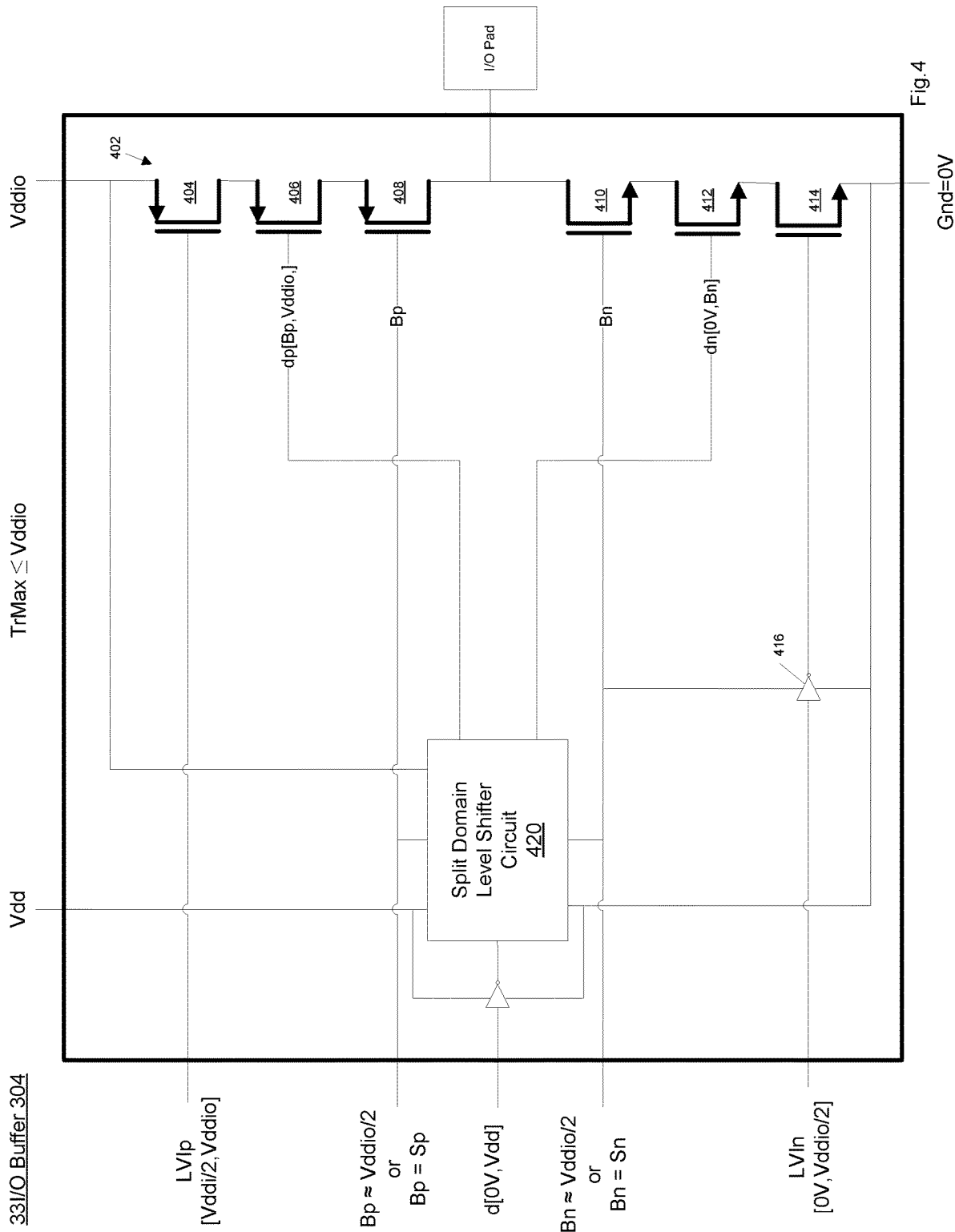
FIG. 4 is a mixed schematic and block diagram illustrating an example I/O buffer that can be employed in the IC of FIG. 3.

With continuing reference to FIG. 3, FIG. 4 illustrates relevant components of an example 33I/O buffer 304, which includes an output stage 402 coupled between output supply voltage Vddio and Gnd=0V. Output stage 402 includes a stack of MOSFETs 404-414 and inverter circuit 416. 33I/O buffer 304 receives low voltage inhibit (LVI) control signals LVIp and LVIn from I/O buffer controller circuit 314. Output stage 402 is tri-stated when P-channel MOSFET 404 and N-channel MOSFET 414 are deactivated when LVIp and LVIn are asserted (i.e, LVIp=Vddio and LVIn=Vddio/2), respectively. Other circuit structures for tri-stating the output stages are contemplated. As noted in FIG. 4, LVIp and LVIn have distinct logic levels [Vddio/2=1.65V, Vddio=3.3V] and [0V, Vddio/2=1.65V], respectively, to ensure that Vgs and Vgd voltages of MOSFETs 404 and 414 do not exceed TrMax=1.8V. MOSFETs 408 and 410 provide overvoltage protection. The gates of MOSFETs 408 and 410 are biased at Bp and Bn, respectively. During normal operation, bias voltages Bp and Bn are set to approximately Vddio/2=1.65V, which is below TrMax=1.8V, and as a result MOSFETs 408 and 410 are not susceptible to overvoltage damage. During sleep mode, more fully described below, bias voltages Bp and Bn are set to Sp=0.55·Vddio≈1.8V and Sn=0.44·Vddio≈1.5V, respectively, to reduce power consumption within 33I/O buffer 306.

Core circuit 302 and output stage 402 operate in separate voltage domains. To accommodate the difference, and to prevent overvoltage damage to MOSFETs 406 and 412, each 33I/O buffer 304 includes a split level shifter circuit 420 that translates input data signal d with logic levels [0V, Vdd] into output data signal dn and dp with logic levels [0V, Bn≈1.65V] and [Bp≈1.65V, Vddio=3.3V], respectively, during normal operation of 33I/O buffer 304. During sleep mode, split level shifter circuit 420 translates input data signals d into output data signals dn and dp with logic levels [0V, Bn=1.5V] and [Bp=1.8V, Vddio=3.3V], respectively.

The 3318I/O Buffer

Figure 5:
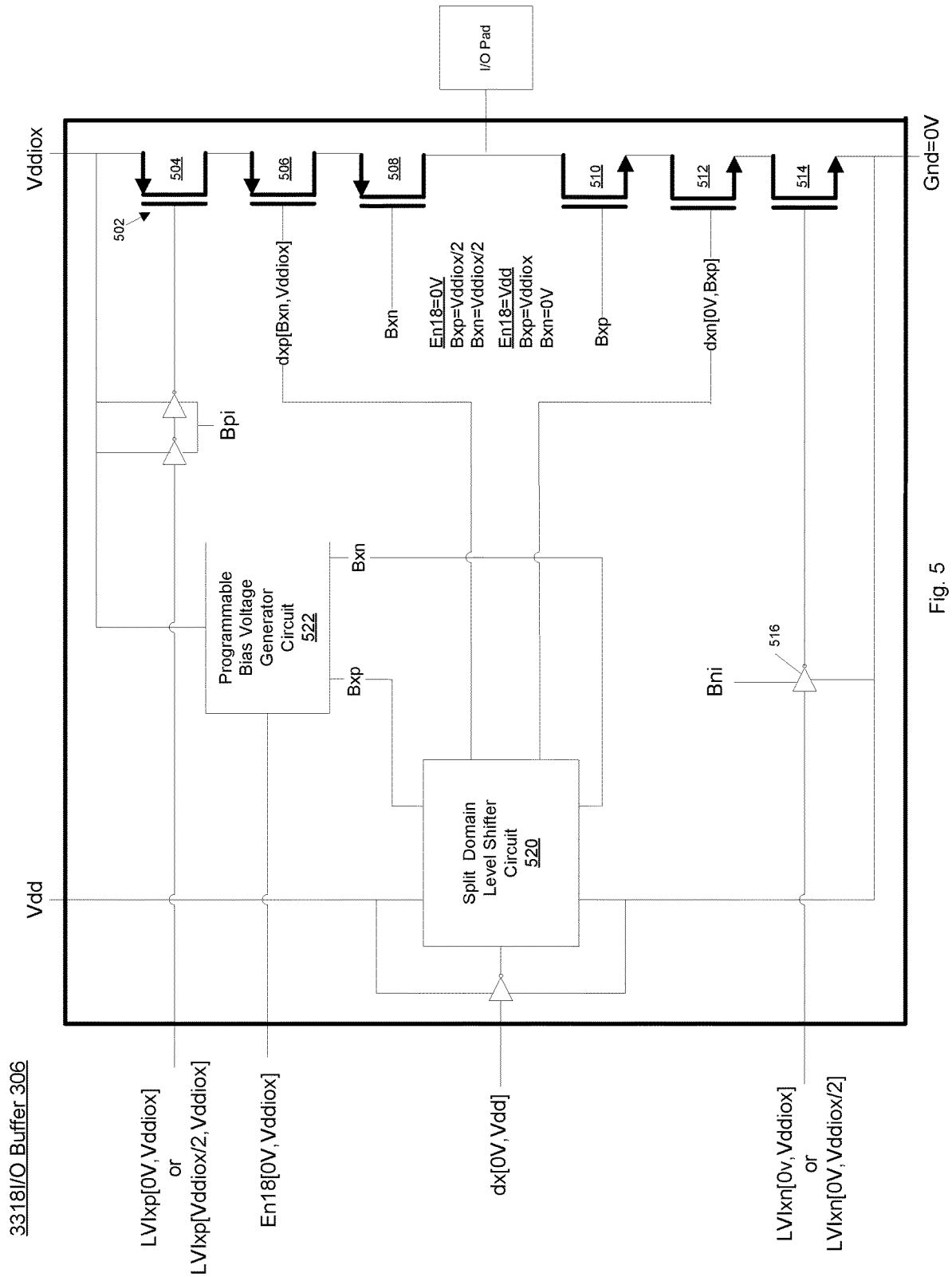
FIG. 5 is a mixed schematic and block diagram illustrating an example of another I/O buffer that can be employed in the IC of FIG. 3.

With continuing reference to FIG. 3, FIG. 5 illustrates relevant components of an example 3318I/O buffer 306, which includes an output stage 502 coupled between Gnd=0V and output supply voltage Vddiox, which can be either 3.3V or 1.8V. Output stage 502 includes a stack of MOSFETs 504-514. 3318I/O buffer 306 receives low-voltage inhibitor LVIxp and LVIxn control signals from I/O buffer controller circuit 316. Output stage 502 can be tri-stated when P-channel MOSFET 504 and N-channel MOSFET 514 are deactivated by LVIxp and the inversion of LVIn, respectively. LVIxp and LVIxn for the 3318I/O buffers 306 have different logic levels [Vddiox/2=1.65V, Vddiox=3.3V] and [0V, Vddiox/2=1.65V], respectively, to ensure that Vgs and Vgd voltages of MOSFETs 504 and 514 do not exceed TrMax=1.8V when Vddiox=3.3V, and LVIxp and LVIxn have the same logic levels [0V, Vddiox=1.8V] when Vddiox=1.8V. The 3318I/O buffer 306 also includes a programmable bias generator 522 for generating Bxn and Bxp based on an input signal En18, which is asserted by 3318I/O buffer controller 316 when Vddiox=1.8V. With En18 asserted, programmable bias voltage generator 522 outputs Bxp=Vddiox=1.8V and Bxn=0V. When En18 is not asserted, which will be the case when Vddiox=3.3V, programmable bias voltage generator 522 outputs Bxp=Bxn=Vddiox/2=1.65V. MOSFETs 508 and 510 provide overvoltage protection when Vddiox=3.3V. Bxn and Bxp biases the gates of MOSFETs 508 and 510, respectively. These transistors will not be damaged by overvoltage when Vddiox=3.3V since their gates are biased at Bxp=Bxn=Vddiox/2=1.65V.

Core circuit 302 and output stage 502 operate in separate voltage domains Vdd=0.8V and Vddiox=1.8V or Vddiox=3.3V. To accommodate the difference, each 3318I/O buffer 306 includes a split level shifter circuit 520 that translates input data signal dx with logic levels [0V, Vdd] into output data signals dxn and dxp with logic levels [0V,Bxp] and [Bxn,Vddiox], respectively. As noted above Bxn=Bxp=Vddiox/2=1.65V when Vddiox=3.3V, and split level shifter 520 translates the input data signals to output data signals dxn and dxp with logic levels [0V,1.65V] and [1.65V,3.3V] to prevent overvoltage damage to MOSFETs 506 and 512. When En18 is asserted (i.e., Vddiox=1.8V), programmable bias voltage generator 522 sets Bxn=0V and Bxp=Vddiox=1.8V, and split level shifter 520 translates the input data signals to output data signals dn and dp with logic levels [0V, 1.8V].

I/O Buffer Controllers

With continuing reference to FIGS. 3-5, IC 300 includes I/O buffer controller 314 and I/O buffer controller 316 for controlling the 33I/O buffers 304 and 3318I/O buffers 306, respectively. These I/O buffer controllers perform various control functions. For example I/O buffer controllers 314 and 316 can inhibit operation of the 33I/O buffers 304 and 3318I/O buffers 306, respectively, when supply voltages Vdd and Vddio, are below minimum values V1 and V2, respectively, which is important since IC 300 lacks the power management control circuit 114 of FIG. 1. I/O buffer controller 314 can also control the biasing voltages Bn and Bp for 33I/O buffers 304 based upon a sleep signal Sleep that is received from core circuit 302. I/O buffer controller 316 can generate the En18 signal that controls the programmable bias voltage generator 522 in each 3318I/O buffer 306 based upon supply voltage Vddiox. Additional functions are contemplated. I/O buffer controller 314 will also be referred to as the 33I/O buffer controller 314, and I/O buffer controller 316 will also be referred to as the 3318I/O buffer controller 316.

The 33I/O Buffer Controller 314

Figure 6:
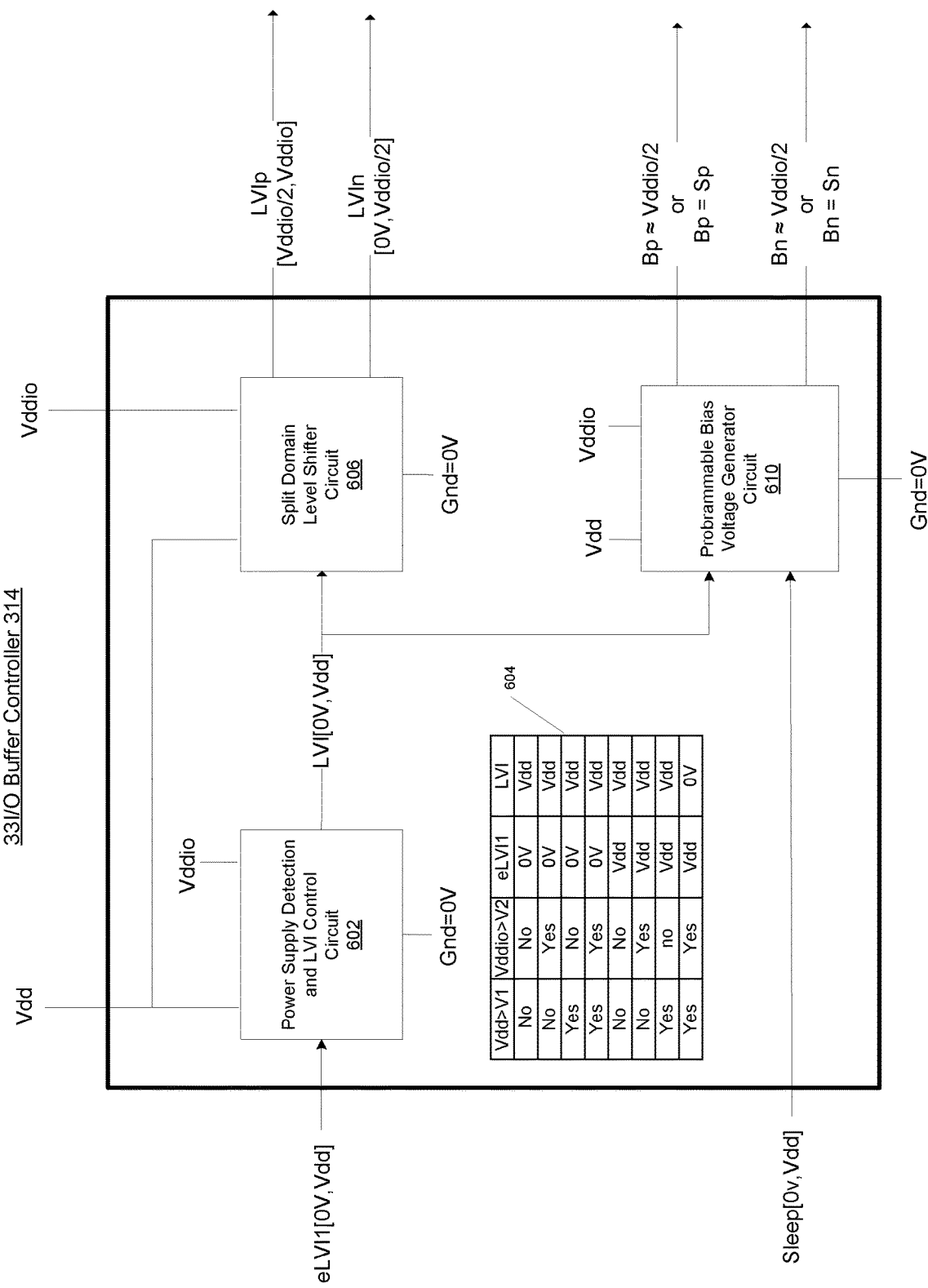
FIG. 6 is a block diagram illustrating an example buffer controller that can be employed in IC of FIG. 3.

FIG. 6 is a block diagram illustrating an example 33I/O buffer controller 314. With continuing reference to FIGS. 3 and 4, the 33I/O buffer controller 314 in FIG. 6 includes a power supply detection circuit 602 that receives an eLVI1 signal from core circuit 302. The core circuit 302 can assert eLVI1 and/or eLVI2 in response to IC 300 receiving a restart or reset signal. The 33I/O buffers 304 and 3318 I/O buffers 306 should tristate when eLVI1 and eLVI2 are asserted. Core circuit 302 can de-assert eLVI1 in response to receiving a signal from a circuit external to IC 302 (e.g., an external PMC circuit similar to that shown in FIG. 1), which should indicate that Vdd and Vddio are greater then minimum thresholds V1 and V2, respectively, and core circuit 302 should de-assert eLVI2 in response to receiving the same signal or a different signal from the external circuit that indicates that Vdd and Vddiox exceed minimum thresholds. Unfortunately the signal(s) received by core circuit 302 may be in error, and Vdd and Vddio may be below V1 and V2, respectively, or Vdd and Vddiox may not exceed minimum thresholds when core circuit 302 de-asserts eLVI1 and/or eLVI2, which could lead to 33I/O buffers 304 or 3318 I/O buffers 306 sending glitch errors to components external to IC 300. Accordingly, 33I/O buffers 304 and 3318 I/O buffers 306 should not be controlled solely based on the state of eLVI1 and eLVI2.

Power supply detection 602 generates LVI based upon eLVI1 and a comparison of core voltage supply Vdd and output voltage supply Vddio to reference voltages V1 and V2, respectively. FIG. 6 shows a table 604 that defines logic circuits employed within power supply detection 602 for generating the LVI signal. Essentially power supply detection 602 will not assert the LVI signal until both Vdd and Vddio exceed V1 and V2, respectively, and eLVI1 is asserted (eLVI=Vdd).

The 33I/O buffer controller 314 includes a split domain level shifter circuit 606 that receives the LVI signal from power supply detection 602 with voltage logic levels [0V, Vdd]. Split domain level shifter 606 translates the LVI signal it receives into LVIn and LVIp, which have different logic levels. Level shifter 606 transmits LVIn and LVIp to each of the 33I/O buffers 304, where they are used to control MOSFETs 404 and 414. As noted above, when LVIn and LVIp are asserted (i.e., LVIn=Vddio/2=1.65V and LVIp=Vddio=3.3V), 33I/O buffers 304 are placed in the tri-state mode.

Figure 7:
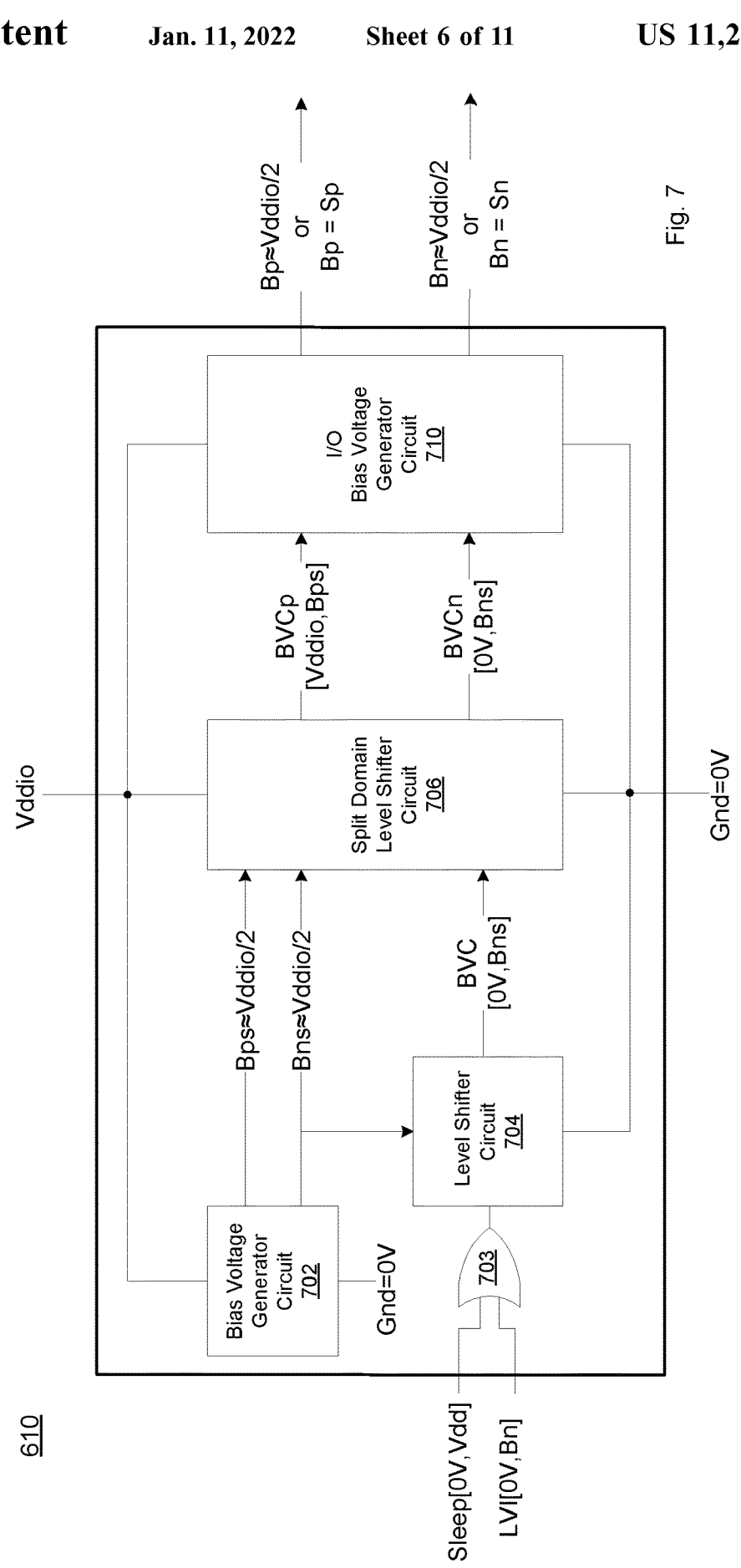
FIG. 7 is a block diagram illustrating one embodiment of a programmable bias voltage generator that can be employed in the buffer controller of FIG. 6.

FIG. 6 also shows that 33I/O buffer controller 314 includes a programmable bias voltage generator circuit 610. This device generates biasing voltages Bn and Bp for the 33I/O buffers 304 based on the Sleep signal received from core circuit 302 or the LVI signal from power supply detection and LVI control 602. When Sleep is asserted, Bn and Bp are adjusted to put the 33I/O buffers 304 into a low-power mode. FIG. 7 illustrates one embodiment of the programmable bias voltage generator 610 in block diagram form, which includes an independent bias voltage generator circuit 702 coupled between Vddio and Gnd=0V. This device generates a separate set of biasing voltages Bns≈Vddio/2 and Bps≈Vddio/2 for level shifter circuit 704 and split domain level shifter circuit 706. Level shifter 704 translates the Sleep signal from core circuit 302 or the LVI signal from power supply detection and LVI control 602 with logic levels [0V,Vdd] into bias voltage control (BVC) signal with logic levels [0V,Bns≈Vddio/2] before it is provided to split domain level shifter circuit 706. Split level shifter 606 translates the BVC signal into BVCp with logic levels [Bps≈Vddio,Vddio/2] and BVCn with logic levels [0V, Bns≈Vddio/2]. BVCp and BVCn control I/O bias voltage generator circuit 710, which in turn generates biasing voltages Bp and Bn for the 33I/O buffers 304. More specifically, if the Sleep signal or the LVI signal is asserted (i.e., Sleep=Vdd or LVI=Vdd), BVCp and BVCn will be asserted high and low (i.e, BVCp=Vddio and BVCn=0V), respectively. In response, I/O bias voltage generator 710 will bias I/O buffer devices 304 with Bp=Sp=0.55·Vddio≈1.8V and Bn=Sn=0.45·Vddio≈1.5V. With Bn and Bp set at these voltages, the 33I/O buffers 304 will consume less power when compared to the power consumed during normal operation. When Sleep and LVI are not asserted, split level shifter 706 outputs BVCp=Bps=Vddio/2 and BVCn=Bns=Vddio/2. In response, I/O bias voltage generator 710 will bias I/O buffer devices 304 with Bn≈Vddio/2 and Bp≈Vddio/2, which might be slightly different magnitude.

Figure 8:
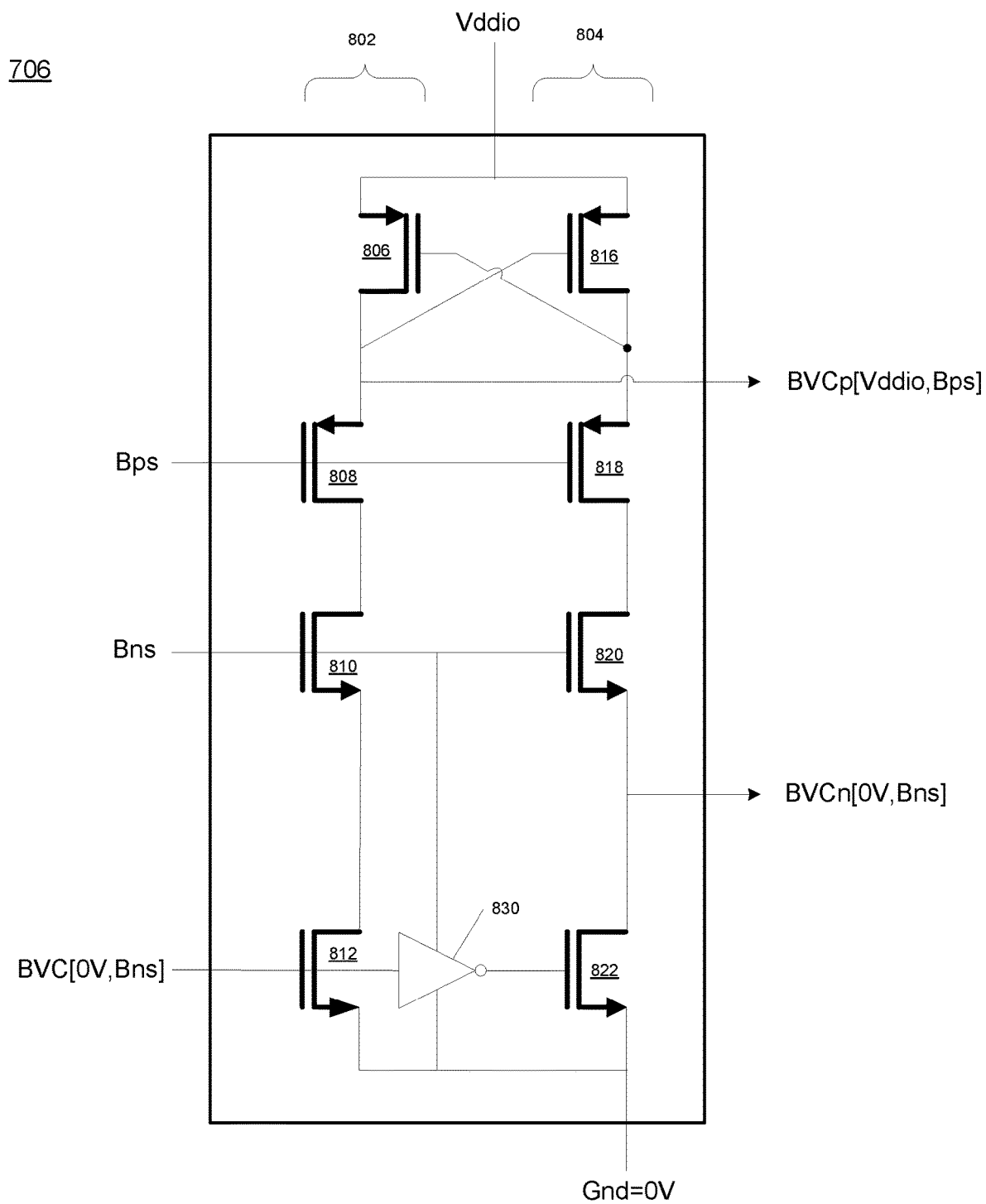
FIG. 8 is a schematic diagram of an example split level shifter that can be employed within the programmable bias voltage generator of FIG. 7.

FIG. 8 illustrates an example of a split level shifter that can be employed in the IC 300. More particularly, FIG. 8 illustrates an example split level shifter 706 that can be employed within programmable bias voltage generator 610 of FIG. 7. With continuing reference to FIG. 7, the split level shifter 706 shown in FIG. 8 includes 2 stacks of MOSFETs 802 and 804. The first stack 802 includes a pair of P-channel MOSFETs 806 and 808 coupled as shown along with a pair of N-channel MOSFETs 810 and 812. The second stack 804 includes a pair of P-channel MOSFETs 816 and 818 coupled as shown along with a pair of N-channel MOSFETs 820 and 822. Inverter circuit 830 and the gate of N-channel MOSFET 812 receive BVC[0V,Bns] from level shifter 704. The output of inverter 830 is received at the gate of N-channel MOSFET 822. Bias voltage Bps is received at the gates of P-channel MOSFETs 808 and 818, while bias voltage Bns is received at the gates of N-channel MOSFETs 810 and 820. BVCp is output from the node that couples the drain and source of P-channel MOSFETs 806 and 808, respectively, while BVCn is output from the node that couples the source and drain of N-channel MOSFETs 820 and 822, respectively. MOSFETs 808, 810, 818, and 820 are provided for overvoltage protection of MOSFETs 806, 812, 816, and 822.

Figure 9:
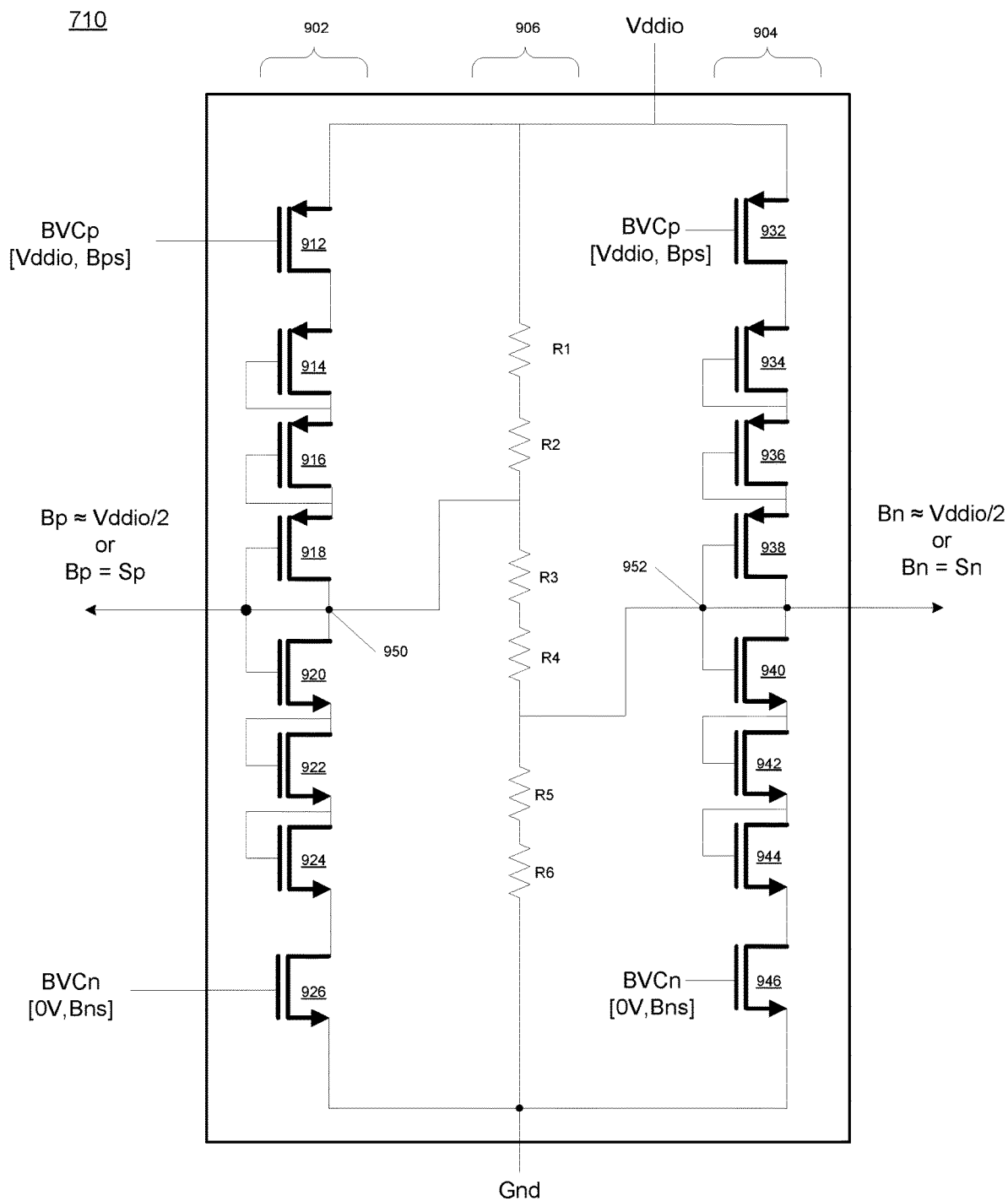
FIG. 9 is a schematic diagram of an example I/O bias voltage generator that can be employed in device of FIG. 7.

As noted in FIG. 7, control signals BVCp and BVCn are provided to I/O bias voltage generator 710. These control signals determine the magnitudes of bias voltages Bp and Bn that are subsequently provided to the 33 I/O buffers 304. FIG. 9 illustrates an example I/O bias voltage generator 710 that can be employed within the programmable bias voltage generator 610 shown within FIG. 7. With continuing reference to FIGS. 7 and 9 bias voltage generator 710 includes separate voltage dividers 902, 904, and 906. Voltage divider 902 includes stack of MOSFETs 912-926 coupled between Vddio and Gnd=0V as shown. Similarly voltage divider 904 includes stack of MOSFETs 932-946 coupled between Vddio and Gnd=0V as shown. Lastly, voltage divider 906 includes a high impedance stack of resistors R1-R6 arranged in series as shown between Vddio and Gnd=0V. Bias generation circuit 710 generates bias voltages Bp and Bn at nodes 950 and 952, respectively. As shown in FIG. 9 output node 950 is coupled to the drains of P-channel MOSFETs 918 and N-channel MOSFET 920, while output node 952 is coupled to the drains of MOSFETs 938 and 940.

Voltage dividers 902 and 904 are directly controlled by BVCp and BVCn. In particular the gates of P-channel MOSFETs 912 and 932 receive control signal BVCp from split level shifter 706, while the gates of N-channel MOS- FETs 926 and 946 receive control signal BVCn. When Sleep is asserted by core circuit 302 (i.e. Sleep=Vdd), split level shifter 706 generates BVCp=Vddio and BVCn=0V, which deactivates voltage dividers 902 and 904 by deactivating MOSFETs 912, 932, 926, and 946. However, voltage divider 906 will generate Bn=Sn=1.5V and Bp=Sp=1.8V at nodes 950 and 952, respectively, while very low current flows through resistors R1-R6. When Sleep=0V, split level shifter 706 generates BVCp=Bps=Vddio/2=1.65V and BVCn=Bps=Vddio/2=1.65V, which in turn activates MOSFETs 912, 932, 926, and 946. MOSFETs 914-924 are essentially the same in gate width and length and in other parameters (e.g., mobility, gate oxide thickness, etc.). The source in each MOSFET is tied to its body. The same features are true for MOSFETs 934-944. As result, voltage dividers 902 and 904 will generate Bn≈Vddio/2≈1.65V and Bp≈Vddio/2≈1.65V nodes 950 and 952, respectively. When Bn and Bp are substantially equal in magnitude (i.e., 1.65V), little to no current will flow through resistors R3 and R4.

3318 I/O Buffer Controller 316

IC 300 of FIG. 3 includes a 3318 I/O buffer controller 316 for controlling 3318 I/O buffers 306 via the LVIxn, LVIxp, Bni, Bpi and En18. As shown the 3318 I/O buffer controller 316 receives stable voltage references BGR1 and BGR2 from a bandgap voltage reference generator circuit 320, which is a device that produces fixed (constant) voltages regardless of power supply variations, temperature changes and circuit loading. BGR1 and BGR2 can be used to determine whether the 3318 I/O buffers 306 are operating with Vddiox=1.8V or Vddiox=3.3V.

Figure 10:
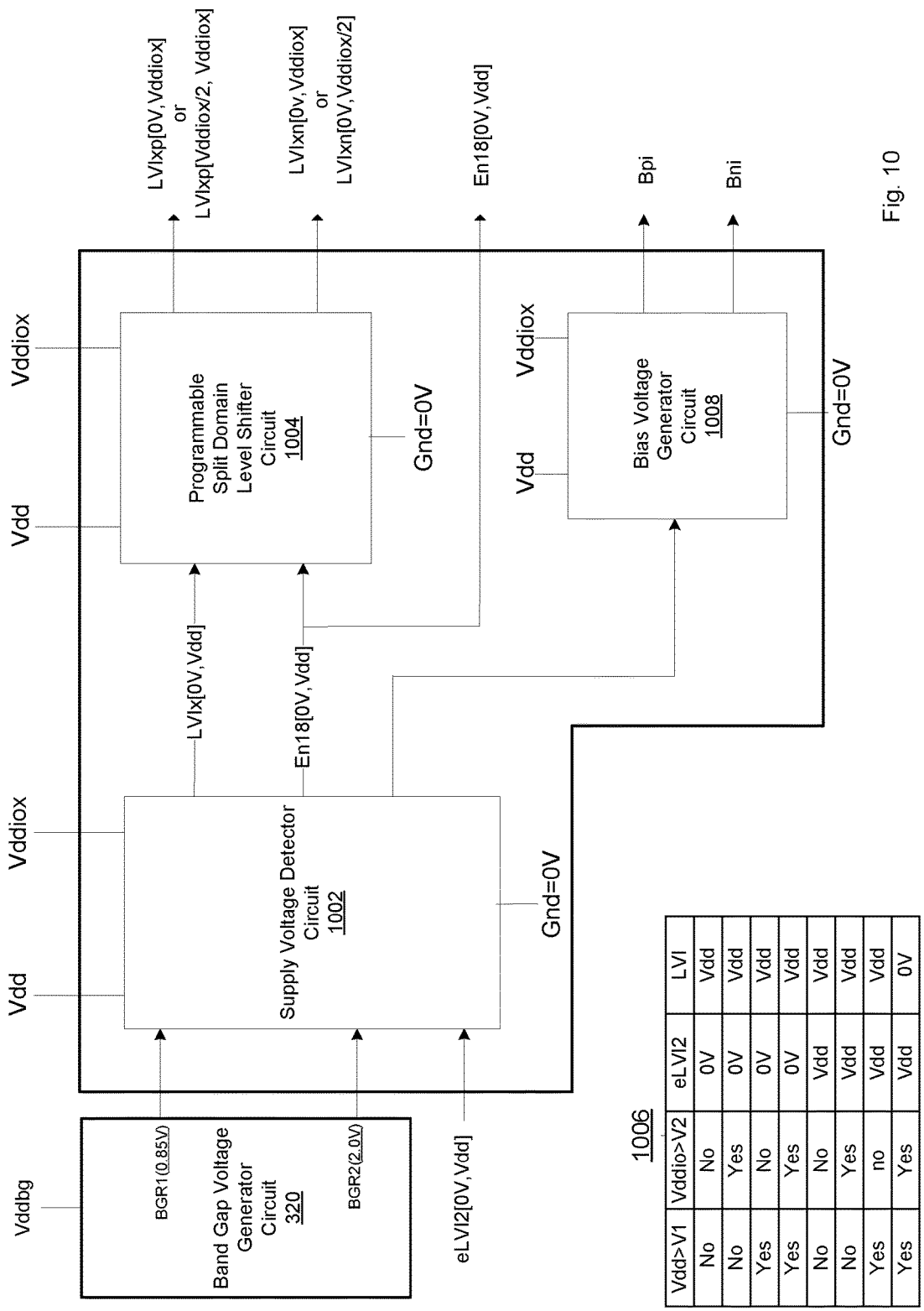
FIG. 10 is a block diagram illustrating another example buffer controller that can be employed in IC of FIG. 3.

With continuing reference to FIGS. 3, 5, FIG. 10 illustrates an example 3318 I/O buffer controller 316. 3318 I/O buffer controller 316 includes a supply voltage detector 1002 and a programmable split domain level shifter 1004. Supply voltage detector 1002 receives BGR1 and BGR2 from bandgap voltage generator 320, and eLVI2 from core circuit 302. Supply voltage detector circuit 1002 generates LVIx based upon a comparison of Vdd and Vddiox to threshold voltages V1 and V2, respectively, and based upon the state of eLVI2. Table 1006 defines operational aspects of logic circuits employed within supply voltage detector 1002 for generating the LVIs signal. Essentially supply voltage detector asserts the LVIx signal unless both Vdd and Vddiox exceed V1 and V2, respectively, and eLVI2 is asserted (eLVI2=Vdd).

Supply voltage detector 1002 generates En18, the signal that controls programmable split domain level shifter 1004 and the programmable bias voltage generator 522 of FIG. 5. Programmable split domain level shifter 1004 receives both LVIx and En18 from voltage supply detector 1002. If En18 asserted, which means Vddiox is presumed equal to 1.8V, programmable split domain level shifter 1004 generates LVIxp and LVIxn with voltage levels [0V,Vddiox]. If, however, En18 is not asserted, which means Vddiox is presumed equal to 3.3V, programmable split domain level shifter 1004 generates LVIxn and LVIxp with voltage levels [0V,Vddiox/2] and [Vddiox/2,Vddio]. Supply voltage detector 1002 compares Vddiox with BGR1 and/or BGR2. In one embodiment, supply voltage detector 1002 determines whether BGR1<Vddiox/3<BGR2. If it is, bias voltage generator circuit 1008, in response to a signal from supply voltage detector 1002, changes bias voltages Bpi and Bni to 0.75*Vddiox, and the bias voltages remain at that level until BGR2<Vddiox/3 at which point bias voltage generator circuit 1008 generates Bpi and Bni at ~Vddiox/2.

Figure 11:
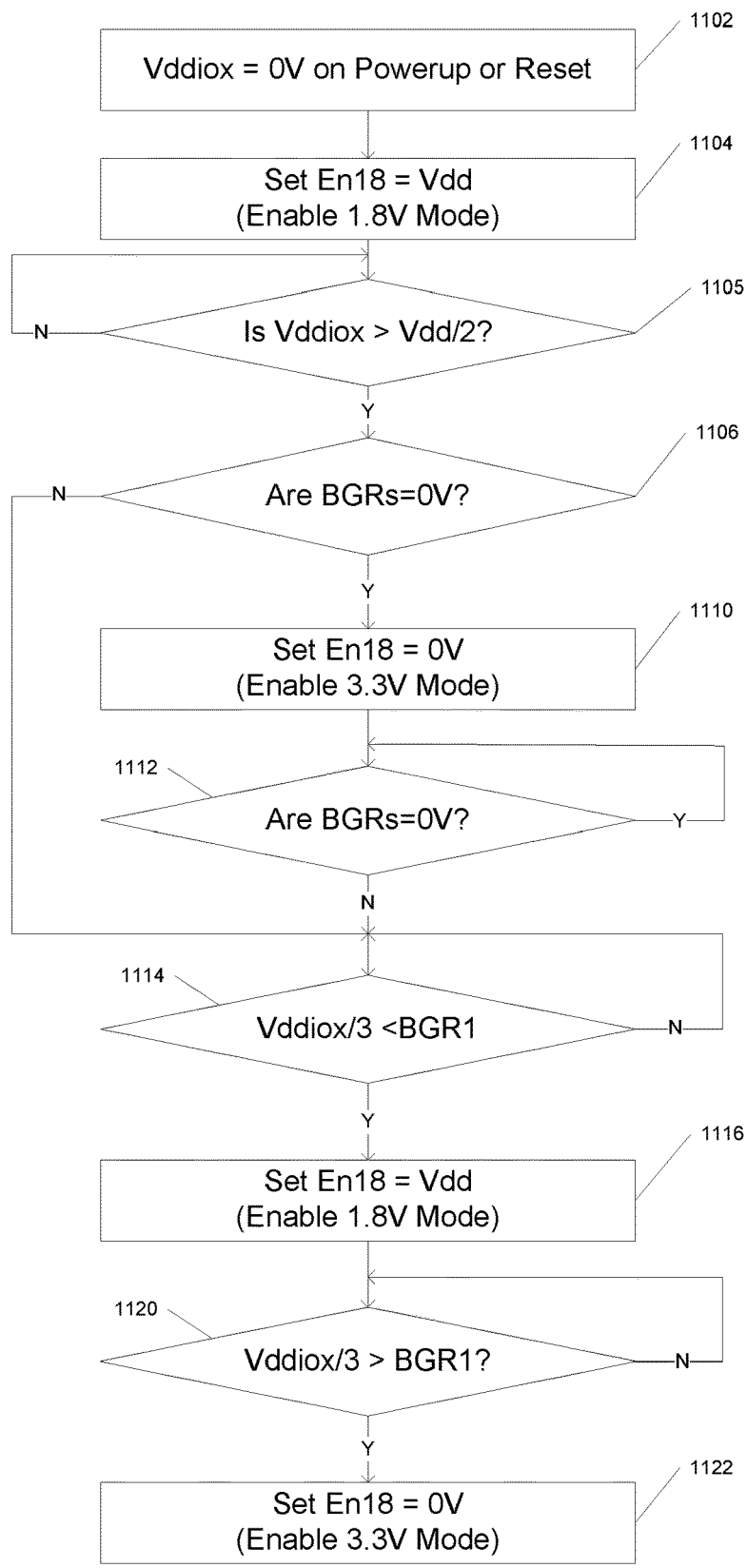
FIG. 11 illustrates relevant aspects of the process employed by a supply voltage detector of FIG. 10.

FIG. 11 illustrates relevant aspects of the process employed by the supply voltage detector 1002 when generating En18. More particularly, the process in FIG. 11 begins when IC 300 reset is detected, and Vddiox starts ramping up from 0V. Supply voltage detector 1002 may detect IC reset when eLVI2 is asserted by core circuit 302. Supply voltage detector 1002 initially asserts En18=Vdd as shown in step 1104. Programmable bias voltage generator circuit 522 in each of the 3318 I/O buffers 306 drives the gates of protection MOSFETs 508 and 510 with Bxn=Vddiox and Bxp=0V in response to assertion of En18. With their gates biased at Bxn=Vddiox and Bxp=0V, MOSFETs 508 and 510 are strongly activated. Supply voltage detector 1002 then determines in step 1106 whether BGR1 and BGR2 are greater than 0V. If BGR1=BGR2=0V, supply voltage detector 1002 sets En18=0V as shown in step 1110. Programmable bias voltage generator circuits 522 in each of the 3318 I/O buffers 306 drives the gates of protection MOSFETs 508 and 510 with Bxp=Vddiox/2 and Bxn=Vddiox/2 in response. With their gates biased at Vddiox/2, MOSFETs 508 and 510 are placed in a safe state and will not be damaged by overvoltage if Vddiox increases beyond 1.8V. If supply voltage detector 1002 determines that BGR1 and BGR2 are greater than 0V, then supply voltage detector 1002 compares Vddiox with BGR1. If supply voltage detector 1002 determines that Vddiox/3<BGR1 in step 1114, then supply voltage detector 1002 reasserts En18 (i.e., En18=Vdd) in step 1116. Supply voltage detector 1002 continues to compare Vddiox with BGR1 after step 1116 and while En18 is asserted. However, if supply voltage detector 1002 determines that Vddiox/3 increases beyond BGR1, then in step 1122 supply voltage detector 1002 resets En18 back to 0V, and the gates of MOSFETs 508 and 510 are biased to Vddiox/2 in order to protect 3318 I/O buffers 316 from overvoltage damage.

Figure 12:
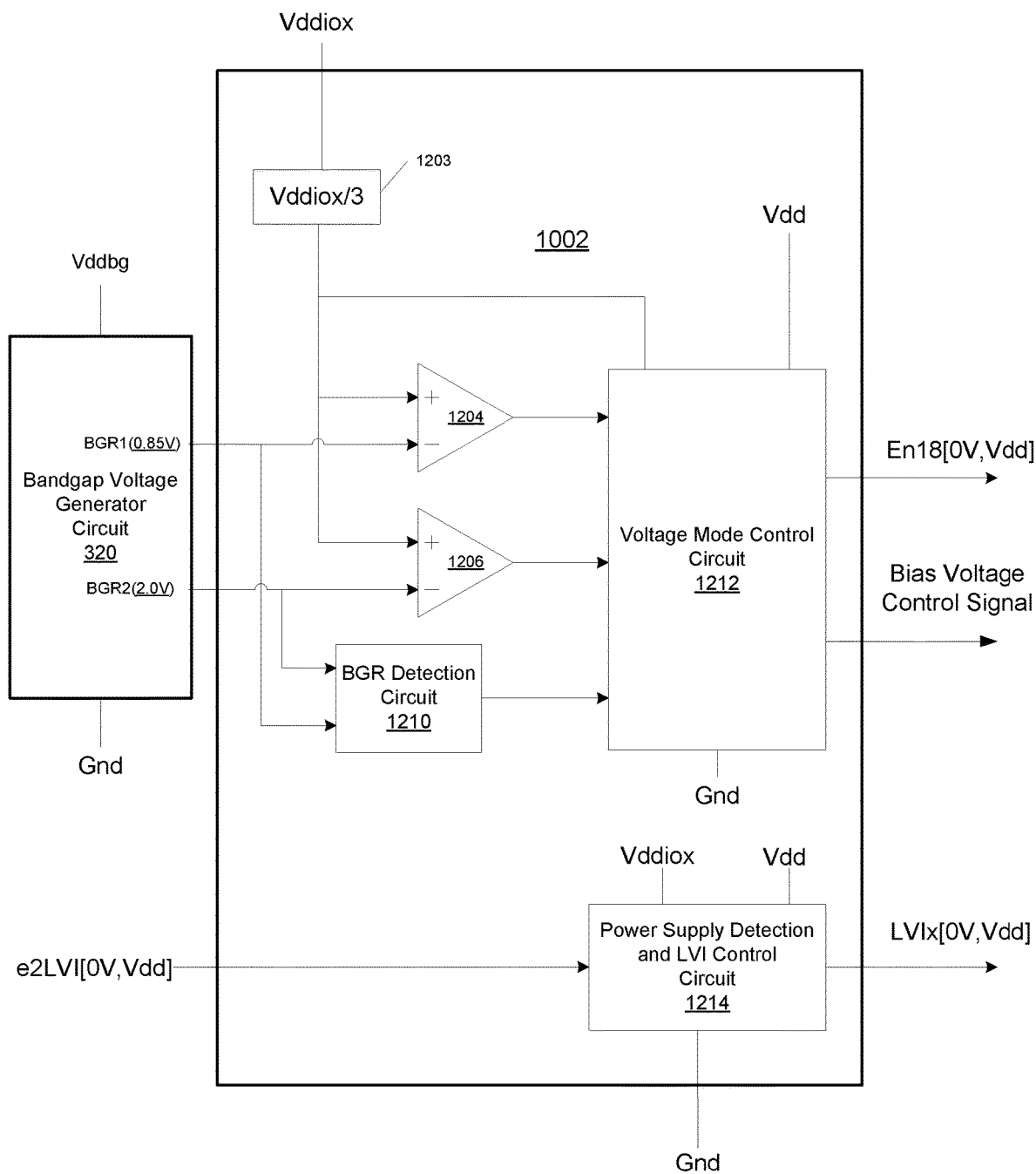
FIG. 12 illustrates an embodiment of the supply voltage detector that can be employed in the controller of FIG. 10.

With continuing reference to FIGS. 10 and 11, FIG. 12 illustrates an embodiment of the supply voltage detector 1002, which includes a pair of comparators 1204 and 1206, a BGR detection circuit 1210 and a voltage mode control circuit 1212. Comparators 1204 and 1206 receive and compare Vddiox/3 from divide-by-three circuit 1203 to BGR1 and BGR2, respectively. Comparators 1204 and 1206 assert their outputs when Vddiox/3 is greater than BGR1 and BGR2, respectively. Voltage mode control circuit 1212 uses the output of comparator 1204 to determine the magnitude of Vddiox in steps 1114 and 1120 of FIG. 11. Voltage mode control circuit 1212 uses comparators 1204 and 1206 to compare Vddiox/3 to BGR1 and BGR2 when generating the bias voltage control signal that controls bias voltage generator circuit 1008 as described above. BGR detection circuit 1210 also receives BGR1 and BGR2 from the bandgap generator 320, and determines whether BGR1 and/or BGR2 are greater than 0V. Voltage mode control circuit 1212 uses the output of BGR detection circuit 1210 to determine whether one or more of the BGRs are equal to 0V in steps 1106 and 1112 of FIG. 11. Lastly, like 33I/O buffer controller 314, supply voltage detector 1002 of FIG. 12 includes a power supply detection circuit 1214 that generates LVIx based upon Vdd, Vddiox, and eLVI2. More particularly, asserts LVIx when supply voltage Vdd or supply voltage Vddiox are below threshold voltages V1 and V2, respectively, or when eLVI2 is asserted. Programmable split domain level shifter 1004 asserts LVIxn and LVIxp when power supply detection circuit 1214 asserts LVIx, which in turn causes 3318 I/O buffers 306 to enter the tri-state mode.

Although the present invention has been described in connection with several embodiments, the invention is not intended to be limited to the specific forms set forth herein.

On the contrary, it is intended to cover such alternatives, modifications, and equivalents as can be reasonably included within the scope of the invention as defined by the appended claims.

What is claimed is:

1. An integrated circuit (IC) comprising:
input/output (I/O) buffers coupled to an output supply voltage terminal that is configured to receive an output supply voltage Vddio, where each of the I/O buffers comprises: a bias voltage generator that is configured to generate a first bias voltage with a magnitude that depends on a control signal; an output stage that receives the first bias voltage, wherein the output stage is configured to drive an I/O pad based upon a data signal received at the I/O buffer; and
an I/O buffer controller coupled to the I/O buffers and configured to generate the control signal based upon a magnitude of the output supply voltage Vddio, wherein the output stage of each I/O buffer comprises:
first and second P-channel MOSFETs coupled in series; and
first and second N-channel MOSFETs coupled in series,
wherein the series coupled P-channel MOSFETs are coupled in series with the series coupled N-channel MOSFETs between the output supply voltage Vddio terminal and a ground terminal,
wherein drains of the second P-channel MOSFET and the first N-channel MOSFET are connected together and to the I/O pad, and
wherein a gate of the second P-channel MOSFET is coupled to receive the first bias voltage.

2. The IC of claim 1 wherein the bias voltage generator of each I/O buffer is configured to generate a second bias voltage that is received by the output stage of the I/O buffer, wherein the second bias voltage has a magnitude that depends upon the control signal.

3. The IC of claim 2 wherein a gate of the second P-channel MOSFET in each of the I/O buffers is coupled to receive the second bias voltage generated by the bias voltage generator of the I/O buffer.

4. The IC of claim 3 wherein the bias generator generates the first and second bias voltages with magnitudes that are substantially equal to each other when the control signal is at a first logic voltage level.

5. The ICF claim 4 wherein the bias generator generates the first and second bias with magnitudes that are substantially equal to each other when the control signal is at a second logic voltage level.

6. An integrated circuit (IC) comprising:
input/output (I/O) buffers coupled to an output supply voltage terminal that is configured to receive an output supply voltage Vddio, where each of the I/O buffers comprises: a bias voltage generator that is configured to generate a first bias voltage with a magnitude that depends on a control signal; an output stage that receives the first bias voltage, wherein the output stage is configured to drive an I/O pad based upon a data signal received at the I/O buffer;
an I/O buffer controller coupled to the I/O buffers and configured to generate the control signal based upon a magnitude of the output supply voltage Vddio;
a bandgap voltage generator configured to generate a first bandgap reference voltage;
wherein the I/O buffer controller is configured to compare the output supply voltage Vddio to be first bandgap reference voltage;
wherein the I/O buffer controller is configured to generate the control signal based upon the comparison of the output supply voltage Vddio to the first bandgap reference voltage.

7. The IC of claim 6:
wherein the bandgap voltage generator configured to generate a second bandgap reference voltage;
wherein the I/O buffer controller is configured to compare the output supply voltage Vddio to be second bandgap reference voltage;
wherein the I/O buffer controller is configured to generate the control signal based upon the comparison of the output supply voltage Vddio to the first bandgap reference voltage and the comparison of the output supply voltage Vddio to the second bandgap reference voltage.

8. An integrated circuit (IC) comprising:
a core circuit coupled to a core supply voltage terminal that is configured to receive a core supply voltage Vdd;
input/output (I/O) buffers coupled to an output supply voltage terminal that is configured to receive an output supply voltage Vddio, wherein each of the I/O buffers comprises an output stage to drive an I/O pad based upon data signal received at the I/O buffer; and
an I/O buffer controller coupled to the I/O buffers and configured to generate first and second control signals based upon magnitudes of the core supply voltage Vdd and the output supply voltage Vddio,
wherein the first and second control signals control the output stages,
wherein the input output stage in each of the I/O buffers is inhibited from driving its I/O pad when the I/O buffer controller generates the first and second control signals with respective logic high voltages, and
wherein the input output stage in each of the I/O buffers is enabled to drive its I/O pad when the I/O buffer controller generates the first and second control signals with respective logic low voltages.

9. The IC of claim 8 wherein the I/O buffer controller generates the first and second control signals with respective logic low voltages when magnitudes of core supply voltage Vdd and output supply voltage Vddio are below threshold voltages V1 and V2, respectively.

10. The IC of claim 9:
wherein the core circuit is configured to generate an inhibit signal when the core circuit receives a signal from a device external to the IC;
wherein the I/O buffer controller generates the first and second control signals with respective logic high voltages when magnitudes of core supply voltage Vdd and output supply voltage Vddio are below threshold voltages V1 and V2, respectively, and when the inhibit signal is asserted.

11. The IC of claim 8:
wherein each of the I/O buffers comprises a bias voltage generator that is configured to generate a first bias voltage with a magnitude that depends on another control signal;
wherein the output stage of each of the I/O buffers receives the first bias voltage from its bias voltage generator;
wherein the I/O buffer controller is configured to generate the other control signal based upon a magnitude of the output supply voltage Vddio.

12. An integrated circuit comprising:
a core circuit that is configured to generate a sleep signal;
input/output (I/O) buffers each comprising an output stage configured to drive an I/O pad based upon a data signal received at the I/O buffer, wherein the output stage of each I/O buffer receives a first bias voltage; and an I/O buffer controller coupled to the I/O buffers and configured to generate the first bias voltage, wherein a magnitude of the first bias voltage depends upon the sleep signal, wherein the output stage of each I/O buffer comprises:

first and second P-channel MOSFETs coupled in series; and first and second N-channel MOSFETs coupled in series, wherein the series coupled P-channel MOSFETs are coupled in series with the series coupled N-channel MOSFETs between an output supply voltage Vddio terminal and a ground terminal, wherein drains of the second P-channel MOSFET and the first N-channel MOSFET are connected together and to the I/O pad, and wherein a gate of the second P-channel MOSFET is coupled to receive the first bias voltage.

13. The IC of claim 12 wherein the I/O buffer controller generates a second bias voltage that is received at a gate of each of the first N-channel MOSFETs, wherein the second bias voltage has a magnitude that depends upon the sleep signal.

14. The IC of claim 13:
wherein the I/O buffer controller is configured to generate the first and second bias voltages with magnitudes that are substantially equal to each other when the sleep signal is asserted;
wherein the I/O buffer controller is configured to generate the first and second bias voltages with magnitudes that are substantially different when the sleep signal is not asserted.

15. The IC of claim 14 wherein each of the I/O buffers comprises a level shifter that is configured to receive the first and second bias voltages.

16. The IC of claim 13:
wherein the I/O offer controller comprises first and second bias voltage generators for generating the first and second bias voltages, respectively, when the sleep signal is not asserted;
wherein the I/O buffer comprises a third bias voltage generator for generating the first and second bias voltages when the sleep signal is asserted.

* * * * *